United States Patent [19]

Nakamura et al.

[11] Patent Number: 5,391,346
[45] Date of Patent: Feb. 21, 1995

[54] METHOD FOR MAKING MOLDED PHOTOINTERRUPTERS

[75] Inventors: Nobuyuki Nakamura; Kazunori Fuji, both of Kyoto, Japan

[73] Assignee: Rohm Co., Ltd., Kyoto, Japan

[21] Appl. No.: 979,281

[22] Filed: Nov. 20, 1992

[30] Foreign Application Priority Data

| Nov. 20, 1991 [JP] Japan | 3-304759 |
| Feb. 25, 1992 [JP] Japan | 4-038140 |
| Sep. 16, 1992 [JP] Japan | 4-246465 |

[51] Int. Cl.⁶ .................... B29C 45/14; B29C 45/32
[52] U.S. Cl. .................... 264/272.14; 264/272.15; 264/272.17; 264/277; 425/123
[58] Field of Search .................... 264/272.14, 272.15, 264/272.17, 259, 277, 275; 425/125, 129.1, 123

[56] References Cited

U.S. PATENT DOCUMENTS

| 3,417,193 | 12/1968 | Cole | 264/272.15 |
| 4,540,533 | 9/1985 | Sahakian | 264/272.14 |

FOREIGN PATENT DOCUMENTS

| 55181359 | 6/1979 | Japan. |
| 55-181359 | 12/1980 | Japan. |
| 57-94965 | 6/1982 | Japan. |
| 60113480 | 11/1983 | Japan. |
| 60-113480 | 6/1985 | Japan. |

Primary Examiner—Jan H. Silbaugh
Assistant Examiner—Angela Ortiz
Attorney, Agent, or Firm—William H. Eilberg

[57] ABSTRACT

A method is provided for making molded photointerrupters by using first and second leadframes. The first leadframe carries a plurality of light emitting devices, whereas the second leadframe carries a plurality of light receiving devices. The apparatus used includes a molding unit which includes: a lower mold member which supports the first leadframe in a horizontal posture; an upper mold member movable vertically toward and away from the lower mold member; and a pair of side mold members movable laterally toward and away from each other between the upper and lower mold members, one of the respective side mold members supporting the second leadframe in a horizontal posture; wherein the respective mold members forms molding cavities when the mold is closed.

8 Claims, 10 Drawing Sheets

METHOD FOR MAKING MOLDED PHOTOINTERRUPTERS

BACKGROUND OF THE INVENTION

1. Field of the Invention

This invention relates to a method for making molded photointerrupters. The present invention also relates to an apparatus for making molded photointerrupters.

2. Description of the Prior Art

As is well known, a photointerrupter is a photoelectric device which include a light emitting device (e.g. light emitting diode) and a light receiving device (e.g. phototransistor or photodiode) opposed to the light emitting device with a certain clearance. A detection signal is generated when an object interrupts the optical path between the two photo devices in the clearance. Such a photointerrupter is disclosed in Japanese Patent Application Laid-open No. 60-113480, Japanese Utility Model Application Laid-open No. 55-181359 and Japanese Utility Model Application Laid-open No. 57-94965 for example.

For the convenience of the following description, reference is now made to FIGS. 14–16 which show a typical prior art photointerrupter.

As shown in FIGS. 14 and 15, the prior art photointerrupter denoted by reference sign PI comprises a light emitting device L1 having a pair of leads P1a, P1b, and a light receiving device L2 also having a pair of leads P2a, P2b. The two photo devices L1, L2 are opposed to each other with a certain clearance, and integrated together by a molded package M made of non-transparent resin.

As shown in FIG. 16, the light emitting device L1 includes a light emitting semiconductor chip C1 mounted on one lead P1b and connected to the other lead P1a by a wire W1. The semiconductor chip C1 together with the wire W1 is enclosed in a molded sub-package M1 made of transparent resin.

As shown in FIG. 17, the light receiving device L2 includes a light receiving semiconductor chip C2 mounted on one lead P2b and connected to the other lead P2a by a wire W2. The semiconductor chip C2 together with the wire W2 is enclosed in a molded sub-package M2 made of transparent resin.

In manufacture, use is made of two leadframes which include a first leadframe A1 carrying pairs of leads P1a, P1b, and a second leadframe A2 also carrying pairs of leads P2a, P2b, as shown in FIG. 18. The respective leadframes A1, A2 are vertically oriented and transferred in parallel to each other by utilizing respective feed holes F1, F2. During transfer, light emitting devices L1 are made for the respective pairs of leads P1a, P1b of the first leadframe A1, whereas light receiving devices L2 are made for the respective pairs of leads P2a, P2b of the second leadframe A2. Then, resinous molded packages M are formed for the respective pairs of photo devices L1, L2, as shown in FIGS. 18 and 19.

FIG. 20 shows a mold which has been conventionally used for forming resinous molded packages M. Specifically, the mold includes a fixed lower mold member 111, a vertically movable upper mold member 112, and a pair of side mold members 113, 114 movable laterally toward and away from each other between the lower and upper mold members 111, 112. The respective mold members 111–114 define a plurality of molding cavities 115 (only one shown) when the mold is closed.

The lower mold member 111 has upward projections 116 associated with each molding cavity 115, and a corresponding pair of photo devices L1, L2 of the two leadframes A1, A2 are made to rest on the respective upward projections 116. The lower mold member further has an ejector pin 117 for pushing up a corresponding molded package M together with the respective leadframes A1, A2 upon opening of the mold.

The upper mold member 112 has a spacer projection 118 associated with each molding cavity 115. When the mold is closed, a corresponding pair of photo devices L1, L2 are held in contact with the spacer projection 118 on both sides thereof. The upper mold member 112 is also provided with gates 119 for injecting fluid resin into the corresponding molding cavity 115.

The respective side mold members 113 have backup projections 120a, 120b associated with each molding cavity 115 for pressing the corresponding pair of photo devices L1, L2 into contact with the corresponding spacer projection 118 when the mold is closed.

The prior art mold shown in FIG. 20 is disadvantageous in the following points.

First, because of the vertical arrangement of the respective leadframes A1, A2 within the mold, the clearance between the lower mold member 111 and each side mold member 113, 114 should be as narrow as possible in order for the respective photo devices L1, L2 to reliably rest on the respective upward projections 116 at the time of introducing the leadframe into the mold. However, it is difficult or relatively time-taking to insert the leadframe in such a narrow clearance. Thus, the prior art mold is not suitable for complete automation of the molding operation, thereby resulting in a cost increase.

Secondly, since each pair of photo devices L1, L2 must rest on the corresponding upward projections 116 during the molding operation, it is inevitable that corresponding holes are formed in the subsequently obtained molded package M. Obviously, the presence of such holes reduces the value of the product. Further, the provision of the upward projections 116 complicates the structure of the mold, resulting in an additional cost increase.

SUMMARY OF THE INVENTION

It is, therefore, an object of the present invention to provide a photointerrupter making method which can be performed easily and efficiently at a reduced cost while also improving the product value.

Another object of the present invention is to provide an apparatus which is suitable for performing such a method.

A further object of the present invention is to realize complete automation of the photointerrupter making method.

According to one aspect of the present invention, there is provided a method of making photointerrupters by using a molding unit, a first leadframe carrying a plurality of light emitting devices, and a second leadframe carrying a plurality of light receiving devices, the molding unit comprising: a lower mold member; an upper mold member movable vertically toward and away from the lower mold member; and a pair of side mold members movable laterally toward and away from each other between the upper and lower mold members; the respective mold members forming a plurality of molding cavities when the molding unit is closed; the method comprising the steps of:

placing one of the first and second leadframes on the lower mold member in a generally horizontal posture while the upper mold member is raised away from the lower mold member with the respective side mold members retreated away from each other;

advancing the respective side mold members toward each other;

placing the other of the first and second leadframes on one of the side mold members in a generally horizontal posture;

lowering the upper mold member toward the lower mold member; and introducing fluid resin into the respective molding cavities.

According to another aspect of the present invention, there is provided an apparatus for making photointerrupters by using first and second leadframes, the first leadframe carrying a plurality of light emitting devices, the second leadframe carrying a plurality of light receiving devices, the apparatus comprising a molding unit which includes:

a lower mold member which supports one of the first and second leadframes in a generally horizontal posture;

an upper mold member movable vertically toward and away from the lower mold member; and a pair of side mold members movable laterally toward and away from each other between the upper and lower mold members, one of the respective side mold members supporting the other of the first and second leadframes in a generally horizontal posture;

wherein the respective mold members forms a plurality of molding cavities when the molding unit is closed.

Preferably, the apparatus comprises a first transfer track for transferring said one leadframe in a generally horizontal posture, and a second transfer track substantially in parallel to the first transfer track for transferring said other leadframe. The first and second transfer tracks may be arranged vertically parallel to each other.

Alternatively, the first and second transfer tracks may be arranged horizontally parallel to each other. In this case, the apparatus may further comprise an inverting mechanism for turning over said other leadframe and for bringing said other leadframe to the first transfer track. Obviously, the provision of the inverting mechanism enables full automation of the manufacturing process.

The inverting mechanism may comprise at least one inverting arm which is pivotable between the first and second transfer tracks for picking up said other leadframe at the second transfer track and for releasing said other leadframe at the first transfer track. In this case, the second transfer track may be provided with a cutout for receiving the inverting arm under said other leadframe supported on the second transfer track.

Further, the first transfer track may be provided with at least one magnet, whereas the inverting arm may be provided with a magnet which affords weaker attraction than the magnet of the first transfer track. In this case, said other leadframe can be reliably retained by the inverting arm at the time of turning over, but that leadframe can be automatically passed onto the first transfer track due to the magnetic attraction difference between the two kinds of magnets.

Other objects, features and advantages of the present invention will be fully understood from the following detailed description given with reference to the accompanying drawings.

DETAILED DESCRIPTION OF THE PREFERRED EMBODIMENTS

Figure 14:
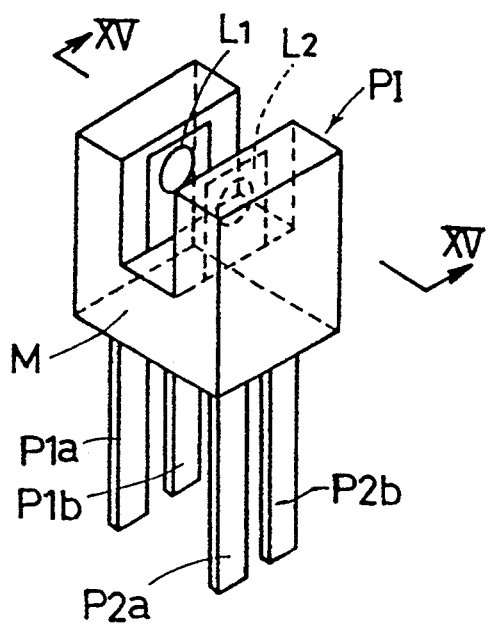
FIG. 14 is a perspective view showing a prior art photointerrupter.
Figure 15:
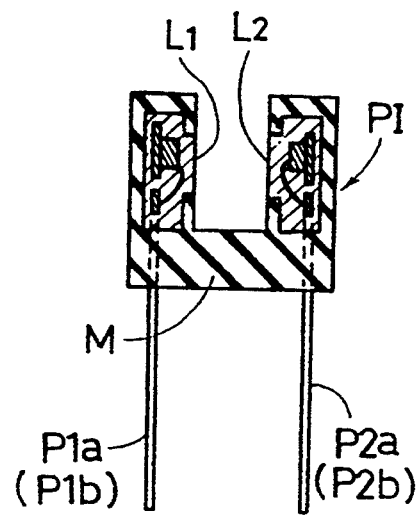
FIG. 15 is a sectional view taken along lines XV—XV in FIG. 14.
Figure 16:
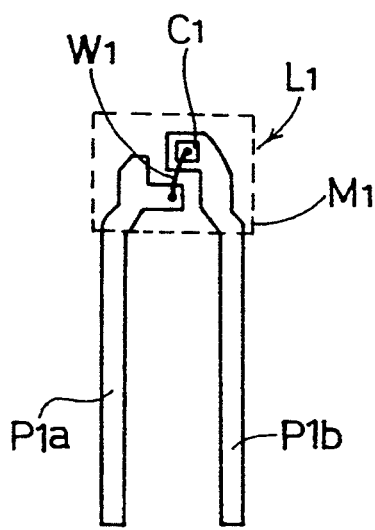
FIG. 16 is a side view showing a light emitting device of the photointerrupter.
Figure 17:
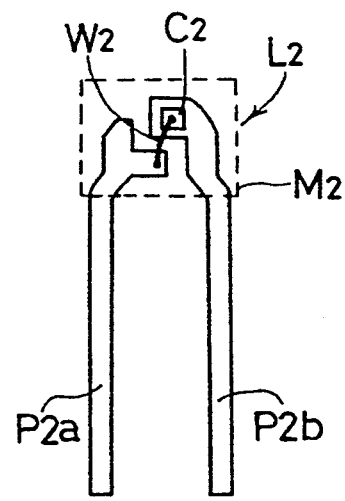
FIG. 17 is a side view showing a light receiving device of the photointerrupter.
Figure 18:
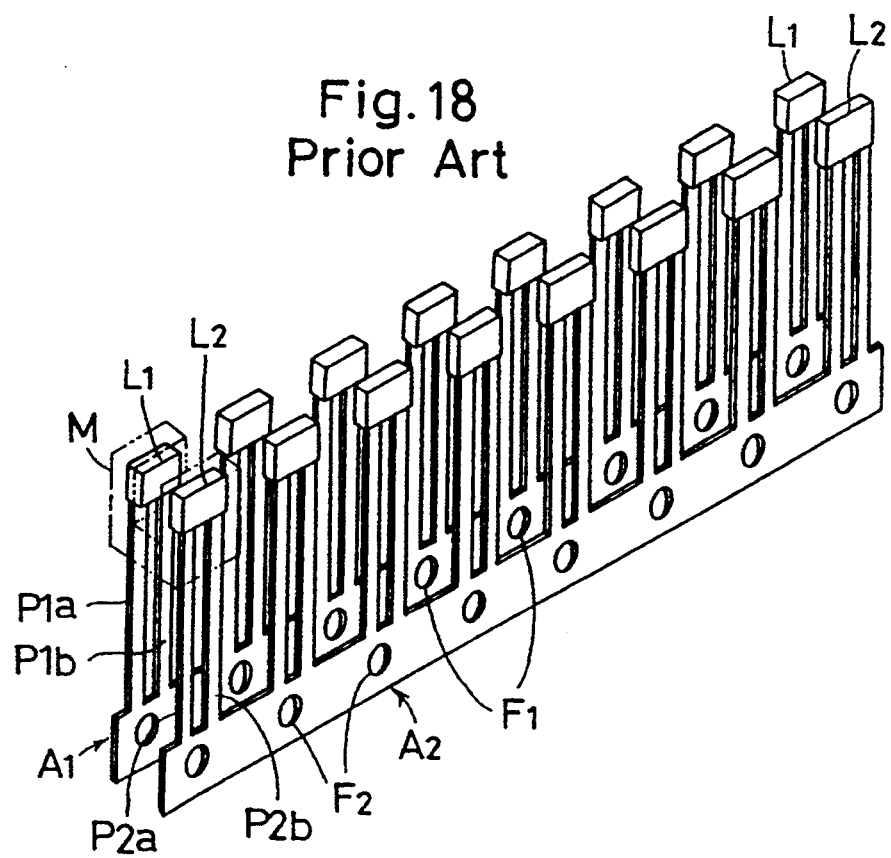
FIG. 18 is a perspective view showing a prior art method of making photointerrupters by using a pair of leadframes.
Figure 19:
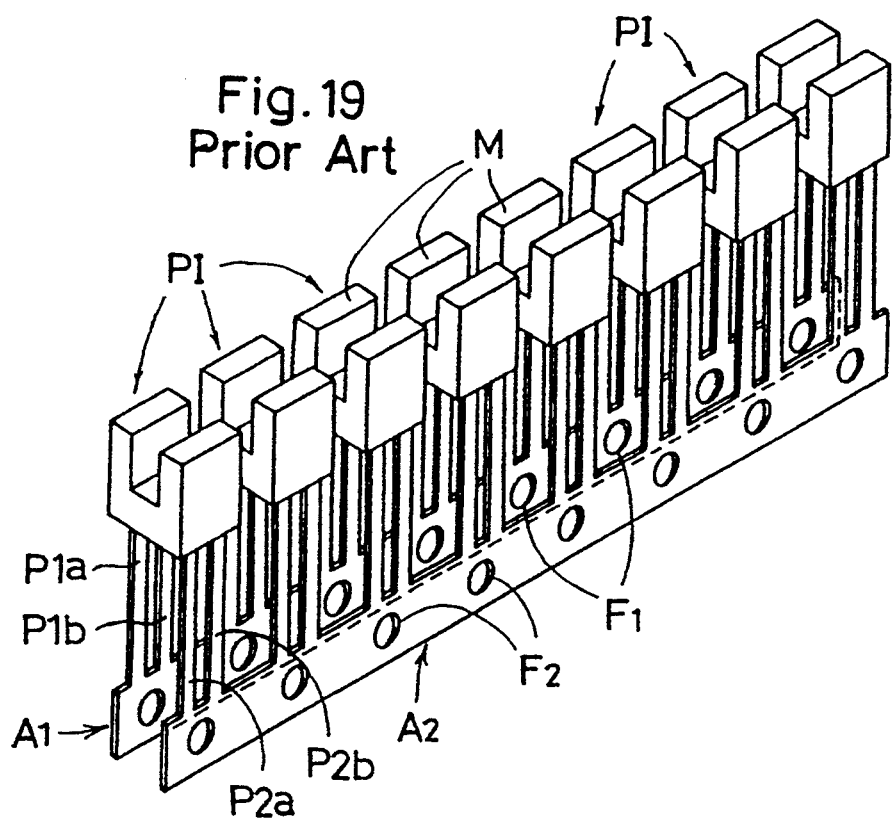
FIG. 19 is a perspective views showing the leadframes after a molding operation.

FIGS. 1 through 12 illustrates a method and apparatus for making molded photointerrupters according to an embodiment of the present invention. The structure per se of the photointerrupter to be made by the present invention is substantially the same as that of the prior art photointerrupter shown in FIGS. 14 and 15. Further, for the making of the photointerrupters, use is also made of pairs of leadframes which are substantially the same as the prior art leadframes shown in FIGS. 18 and 19. Thus, the details of the photointerrupter and leadframe themselves are treated as already described to avoid duplication of description.

Figure 1:
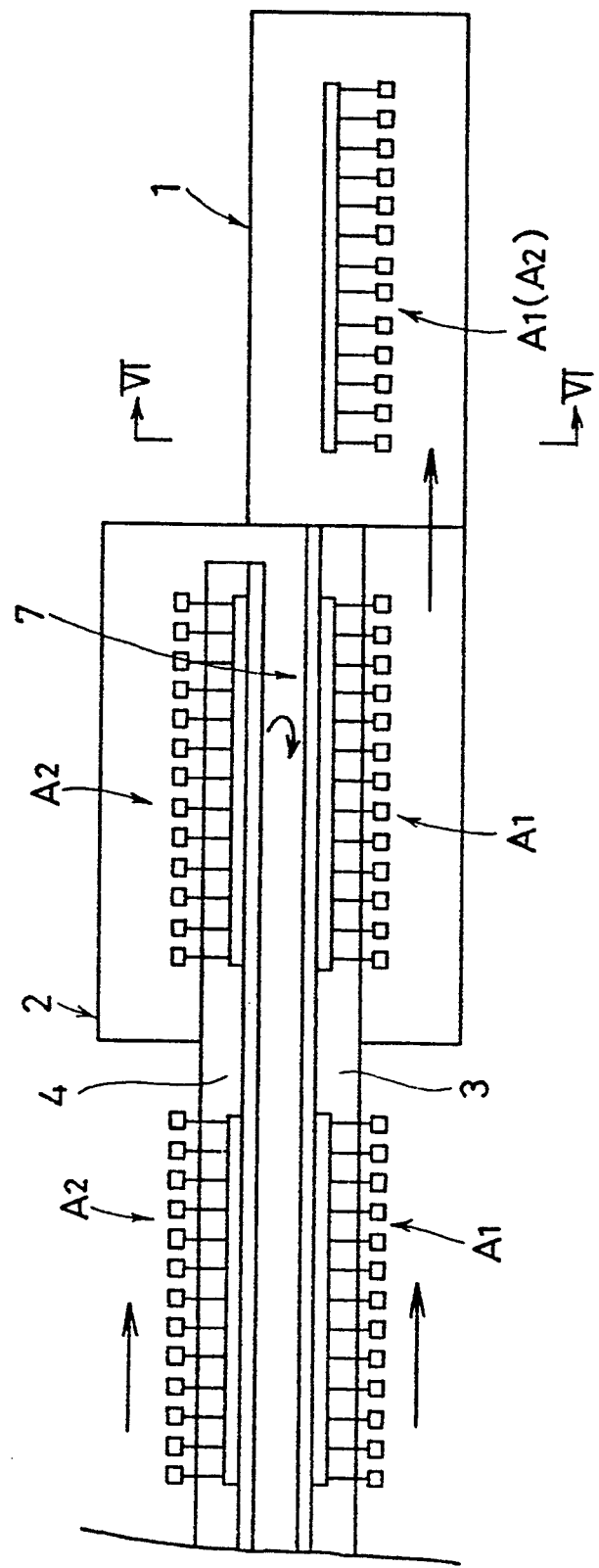
FIG. 1 is a schematic plan view showing a manufacturing apparatus according to the present invention.
Figure 2:
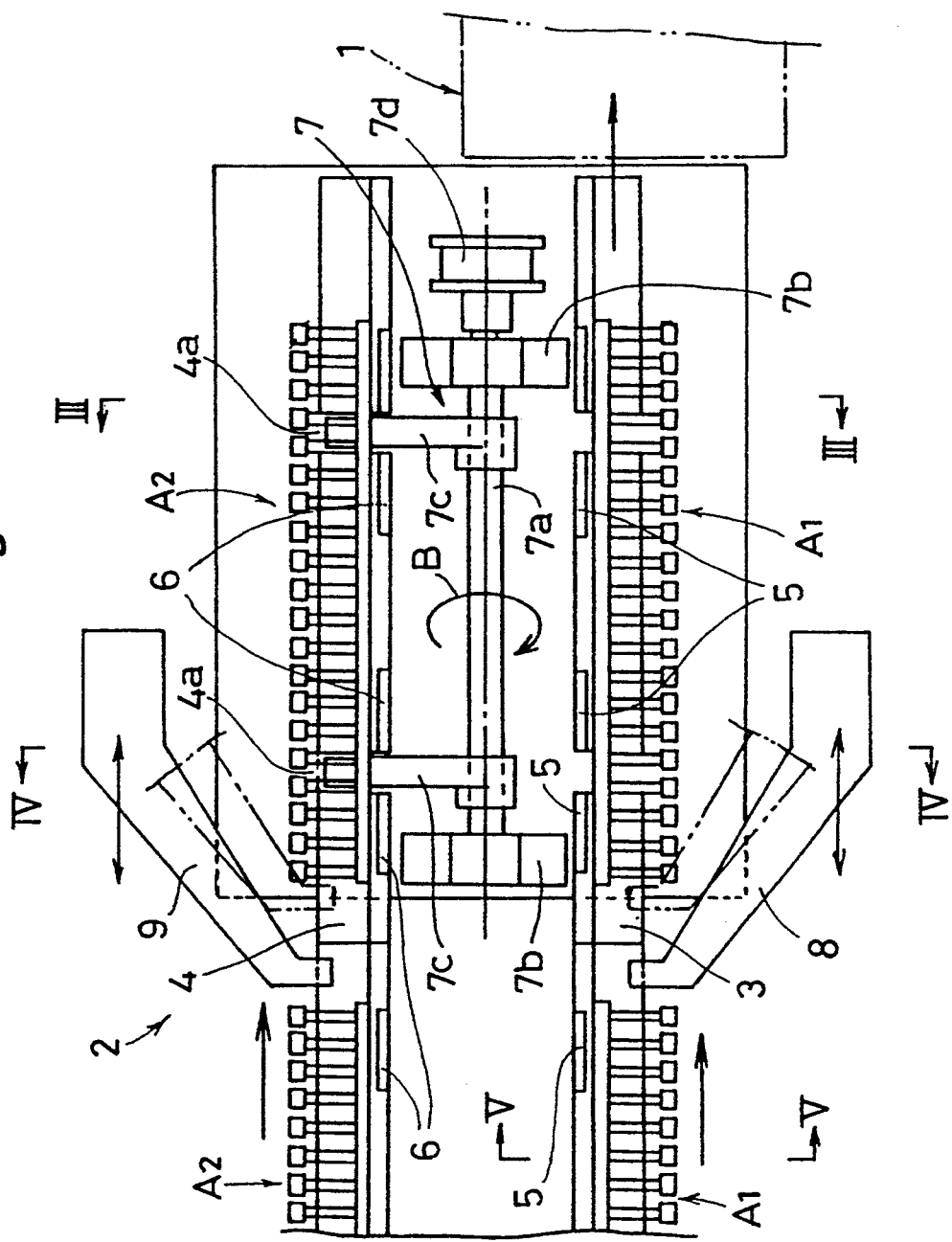
FIG. 2 is an enlarged plan view of the same apparatus.

As shown in FIGS. 1 and 2, the apparatus of this embodiment mainly comprises a molding unit 1 and a supply unit 2 arranged generally in series with the molding unit 1. The supply unit 2 includes a first transfer track 3 for guiding each first leadframe A1 with the respective light emitting devices L1 (see FIGS. 14 and 15) directed upward, and a second transfer track 4 for guiding each second leadframe A2 with the respective light receiving devices L2 (see also FIGS. 14 and 15) directed upward. The respective transfer tracks 3, 4 are substantially horizontal and parallel to each other.

Figure 3:
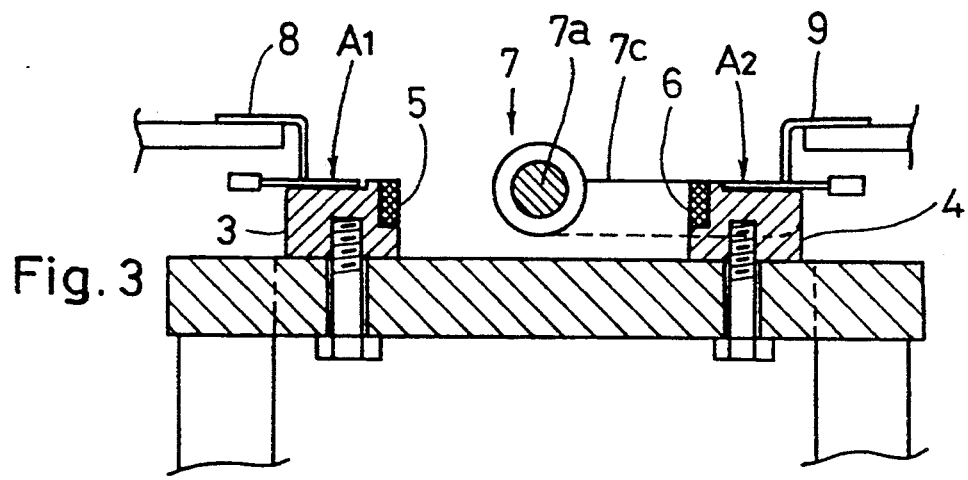
FIG. 3 is a sectional view taken along lines III—III in FIG. 2.
Figure 5:
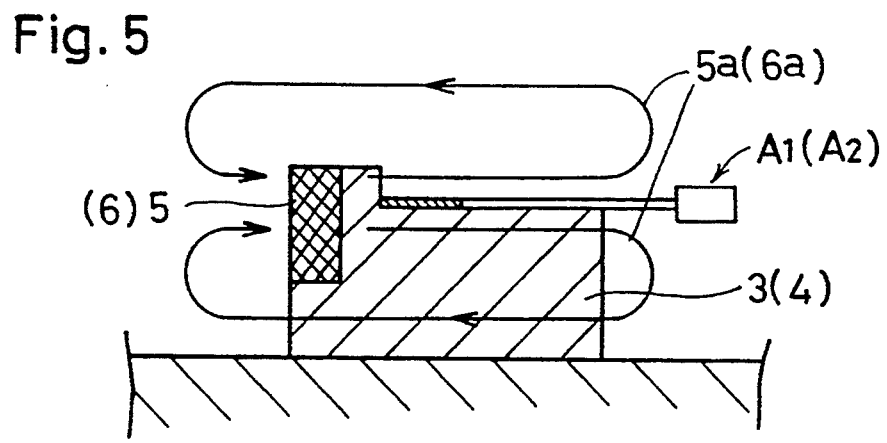
FIG. 5 is a sectional view taken on lines V—V in FIG. 2.

As shown in FIGS. 2 and 3, the first transfer track 3 is provided with a plurality of anisotropic magnets 5 spaced longitudinally of the first transfer track. Similarly, the second transfer track 4 is also provided with a plurality of anisotropic magnets 6 spaced longitudinally of the second transfer track. These magnets 5, 6 generate magnetic fluxes 5a, 6a for holding the respective leadframes A1, A2 horizontally during transfer thereof, as shown in FIG. 5.

Adjacent to the molding unit 1 and between the two transfer tracks 3, 4, there is provided an inverting mechanism 7 for turning over one of the paired leadframes A1, A2 and bringing it to the position previously occupied by the other leadframe. The details of the inverting mechanism 7 is shown in FIGS. 2–4.

Specifically, in the illustrated embodiment, the inverting mechanism 7 includes a rotary shaft 7a rotatably supported by a pair of bearings 7b and extending longitudinally of the respective transfer tracks 3, 4. The rotary shaft 7a supports a pair of inverting arms 7c extending transversely into the second transfer track A2 which has a corresponding pair of cutouts 4a (see FIG. 2) for receiving the respective inverting arms 7c. Each of the inverting arms 7c may be made of steel for example. The rotary shaft 7a is driven for rotation by an electric motor 7d (FIG. 2).

Normally, the respective inverting arms 7c are located under the second leadframe A2 supported on the second transfer track 4. When the inverting arms 7c are rotated in the direction of an arrow B (FIGS. 2 and 4), the second leadframe A2 is forcibly lifted off the second transfer track 4 and inverted as the second leadframe A2 is brought to the first transfer track 3. It should be appreciated that the first leadframe A1 has been already transferred into the molding unit 1 before the second leadframe A2 is turned over by the inverting mechanism 7.

Figure 4:
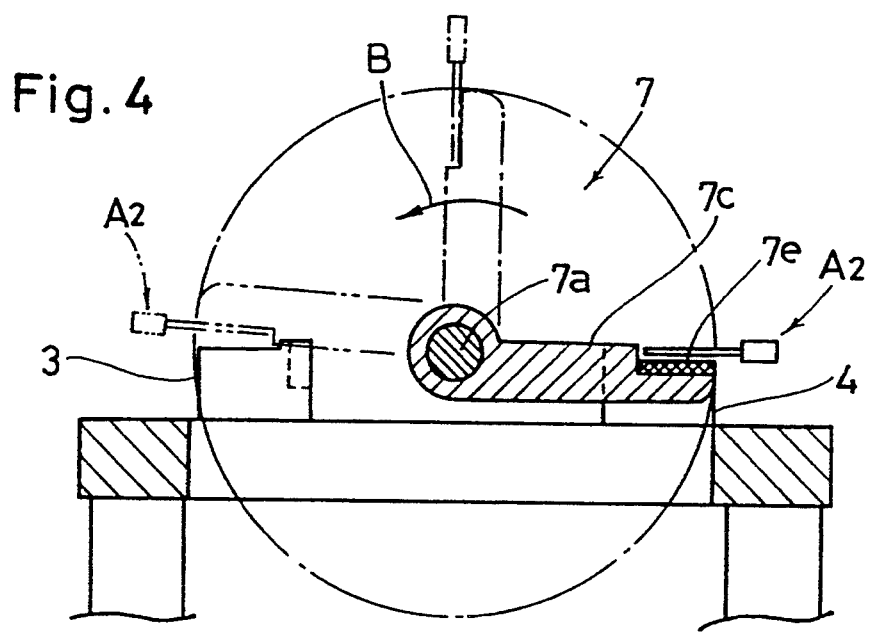
FIG. 4 is a sectional view taken along lines IV—IV in FIG. 2.

As shown in FIG. 4, each of the inverting arms 7c is provided with an isotropic magnet 7e for stably holding the second leadframe A2 during an inverting operation. However, the magnetic attraction of the magnet 7e is set weaker than that of the magnets 5 for the first transfer track 3. Such setting enables the second leadframe A2 to be automatically transferred onto the first transfer track 3 when the second leadframe A2 approaches the first transfer track 3.

The supply unit 2 further includes a first transfer member 8 arranged near the first transfer track 3, and a second transfer member 9 arranged near the second transfer track 4. The first and second transfer members 8, 9 are movable horizontally to transfer the respective leadframes A1, A2 along the respective transfer tracks 3, 4 while accurately positioning these leadframes. The respective transfer members 8, 9 are also movable vertically to enable sequentially transferring successive pairs of leadframes.

As shown in FIGS. 7 through 10, the molding unit 1 comprises a mold which includes a fixed lower mold member 11 and a vertically movable upper mold member 12. The mold further includes a pair of side mold members 13, 14 which are movable toward and away from each other transversely of the respective leadframes A1, A2.

Figure 7:
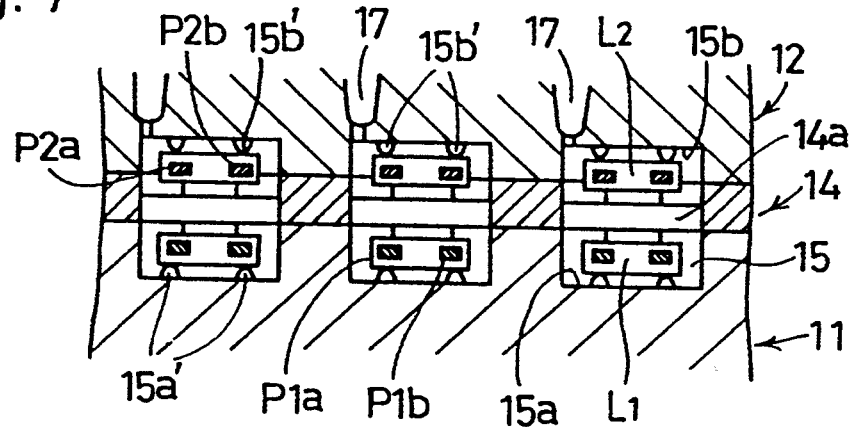
FIG. 7 is a sectional view taken along lines VII—VII in FIG. 6.
Figure 8:
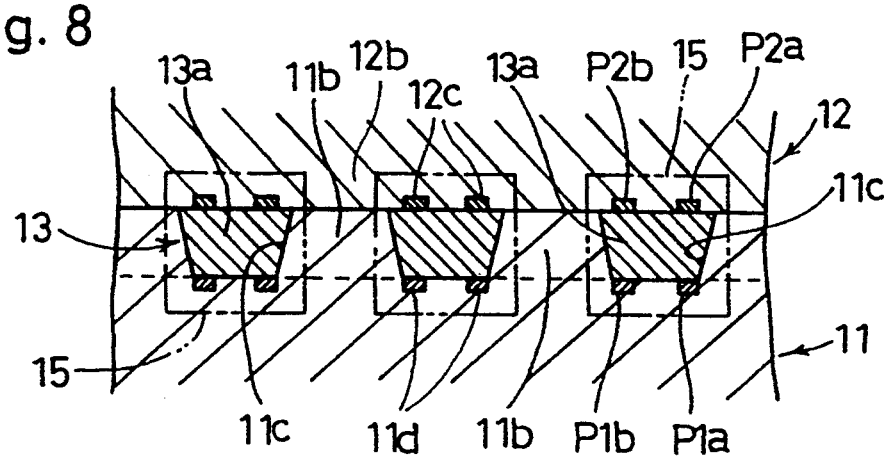
FIG. 8 is a sectional view taken along lines VIII—VIII in FIG. 6.
Figure 9:
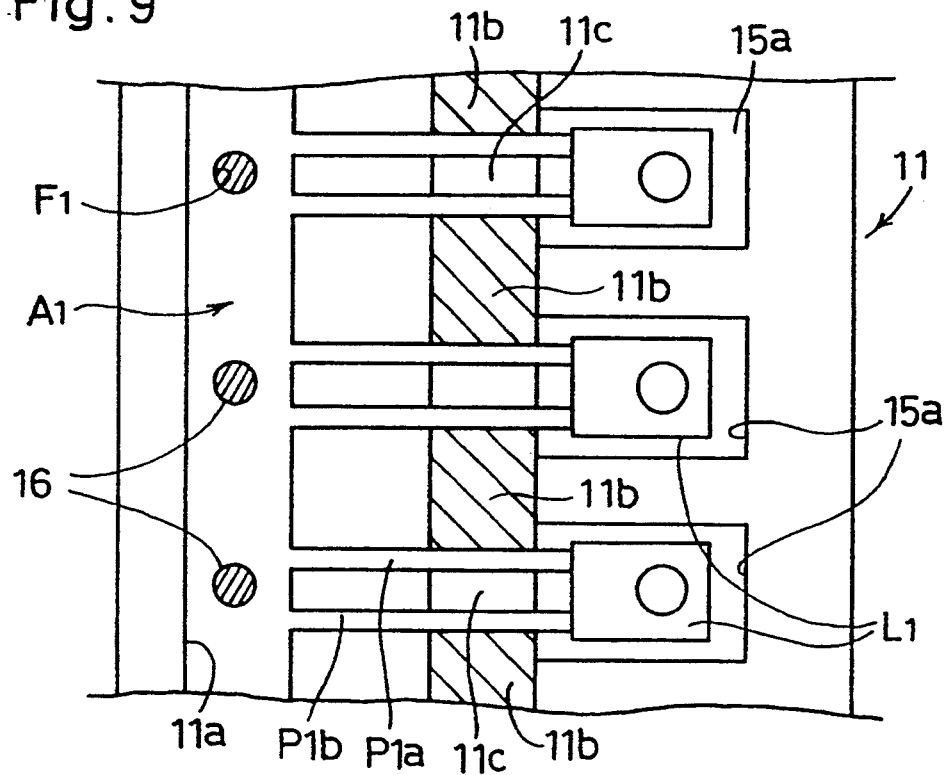
FIG. 9 is a sectional view taken along lines IX—IX in FIG. 6.
Figure 10:
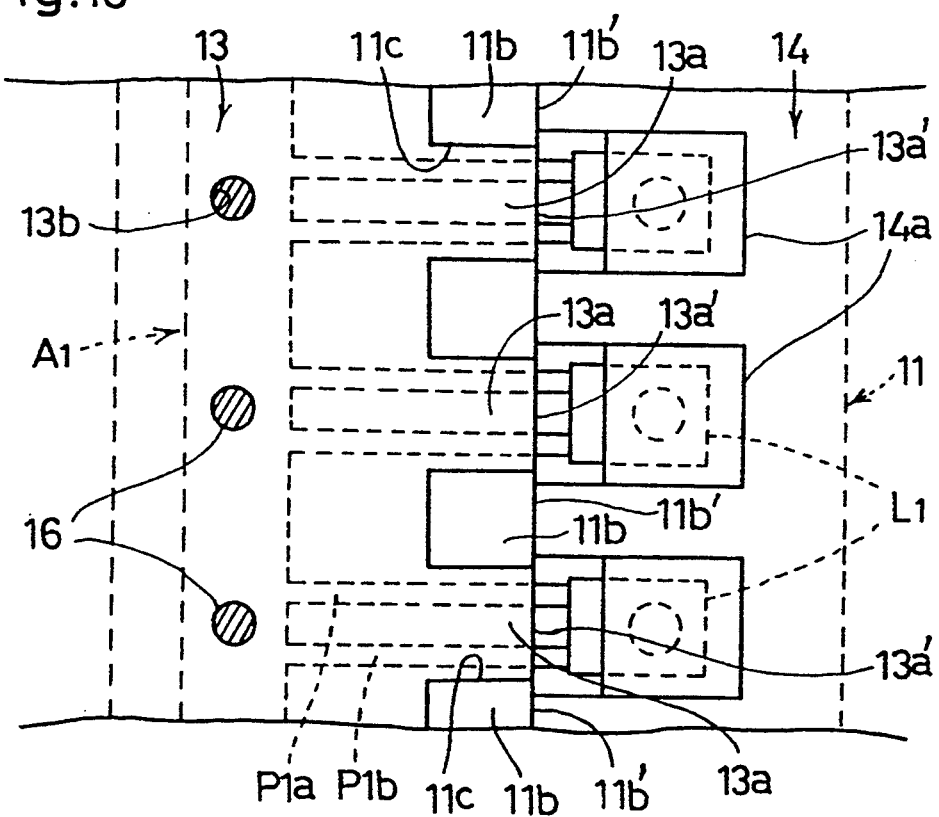
FIG. 10 is a sectional view taken along lines X—X in FIG. 6.

The lower mold member 11 has a plurality of lower molding recesses 15a spaced longitudinally of the respective leadframes A1, A2 (see FIGS. 7 and 9), whereas the upper mold member 12 has a plurality of upper molding recesses 15b also spaced longitudinally of the leadframes (FIG. 7). When the mold is closed, each of the lower recesses 15a together with a corresponding upper recess 15b forms a molding cavity 15 for accommodating a corresponding pair of photo devices L1, L2.

Each of the lower molding recesses 15a is provided with lower backup projections 15a' for pressing the corresponding light emitting device L1. Similarly, each of the upper molding recesses 15b is provided with upper backup projections 15b' for pressing the corresponding light receiving device L2.

The lower mold member 11 has a lower longitudinal recess 11a for receiving the first leadframe A1. Further, the lower mold member 11 has a plurality of lower integral dams 11b arranged between the lower longitudinal recess 11a and the series of lower molding recesses 15a. The dams 11b are alternate with guide recesses 11c, and each of the guide recesses 11c has its bottom formed with a pair of lower grooves 11d (FIG. 8) for receiving the corresponding pair of leads P1a, P1b of the first leadframe A1. Each of the dams 11b has an end face 11b' adjoining the corresponding molding cavity 15.

Figure 6:
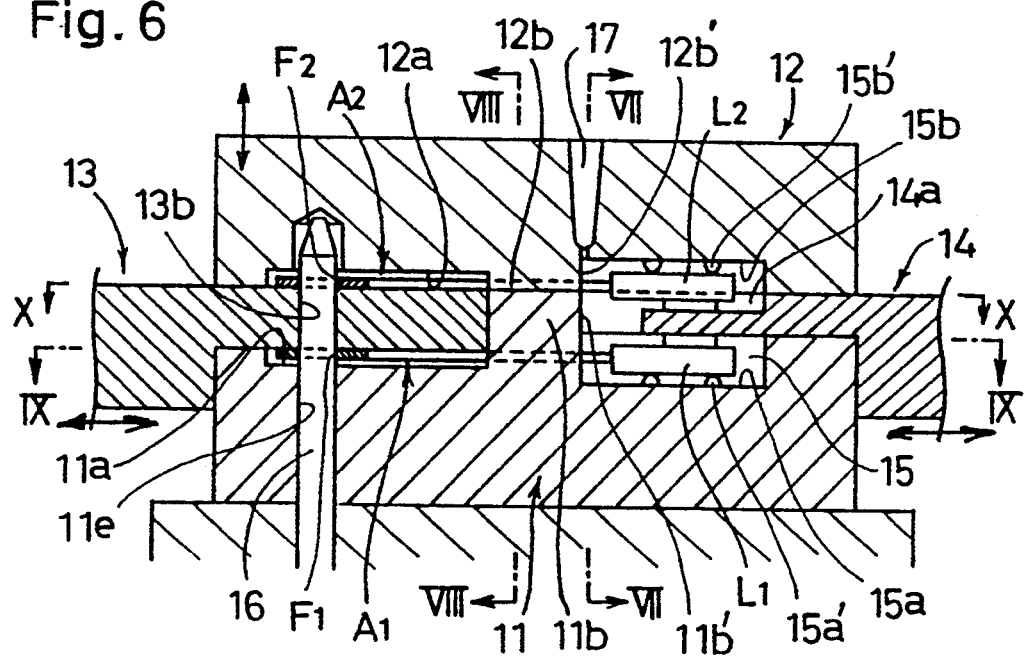
FIG. 6 is a sectional view taken along lines VI—VI in FIG. 1 to show a mold incorporated in the manufacturing apparatus.

The lower mold member 11 also has a plurality of guide bores 11e which are spaced longitudinally of the respective leadframes A1, A2 (see FIG. 6). Each of the guide bores 11e receives a positioning pin 16 which is vertically movable into and out of the corresponding feed holes F1, F2 of the respective leadframes A1, A2.

The upper mold member 12 has an upper longitudinal recess 12a for receiving the second leadframe A2. The upper mold member 12 also has an upper integral dam 12b which is continuous longitudinally of the second leadframe A2 to rest on the series of lower dams 11b. The upper dam 12b is formed with pairs of upper grooves 12c for receiving the corresponding pairs of leads P2a, P2b of the second leadframe A2. Further, the upper dam 12b has a longitudinal edge face 12b' which is flush with the respective end faces 11b' of the lower dams 11b to adjoin the respective molding cavities 15.

Further, the upper mold member 12 is formed with a plurality of gates 17 in corresponding relation to the respective molding cavities 15. Each of the gates 17 communicates with the corresponding molding cavity 15 for introducing fluid resin thereinto.

The side mold member 13 has a plurality of closure projections 13a fittable in the respective guide recesses 11c of the lower mold member 11. Each of the closure projections 13a has an end face 13a' (see FIG. 10) which becomes flush with the longitudinal edge face 12b' of the upper dam 12b to adjoin the corresponding molding cavity 15 when the side mold member 13 is completely advanced.

The side mold member 13 is further formed with a plurality of through-holes 13b in alignment with the guide bores 11e of the lower mold member 11. Each of the through-holes 13b allows passage therethrough of the corresponding positioning pin 16 for accurate positioning of the second leadframe A2 when the side mold member 13 is completely advanced.

The other mold member 14 has a plurality of spacers 14a in corresponding relation to the respective molding cavities 15. Each of the spacers 14a enters between the corresponding pair of photo devices L1, L2 within the corresponding molding cavity 15 when the mold member 14 is completely advanced.

By using the molding unit 1 and the supply unit 2, a molding operation is performed in the following manner.

Figure 11:
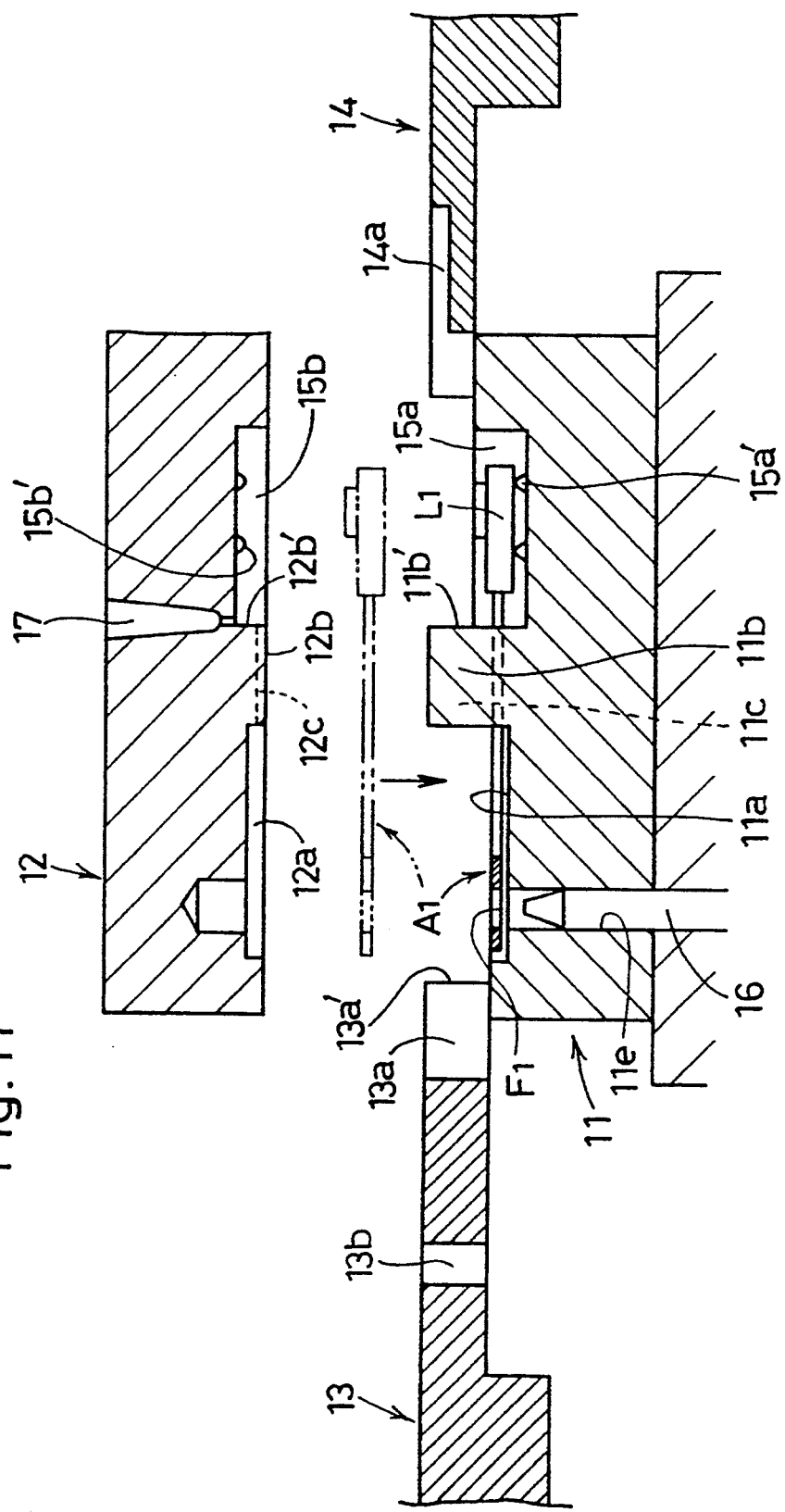
FIG. 11 is s sectional view similar to FIG. 6 but showing the mold in its open state.

First, as shown in FIG. 11, the upper mold member 12 is raised away from the lower mold member 11, and the respective side mold members 13, 14 are retreated away from each other. In this condition, the first leadframe A1 supported on the first transfer track 3 (FIGS. 1 and 2) is horizontally transferred into the molding unit 1 (as indicated by phantom lines in FIG. 11) and allowed to fall in the lower mold member 11 (as indicated by solid lines in FIG. 11). As a result, the respective light emitting devices L1 are placed in the corresponding lower molding recesses 15a with their emission faces directed upward, whereas the respective pairs of leads P1a, P1b are fitted in the corresponding guide recesses 11c.

Figure 12:
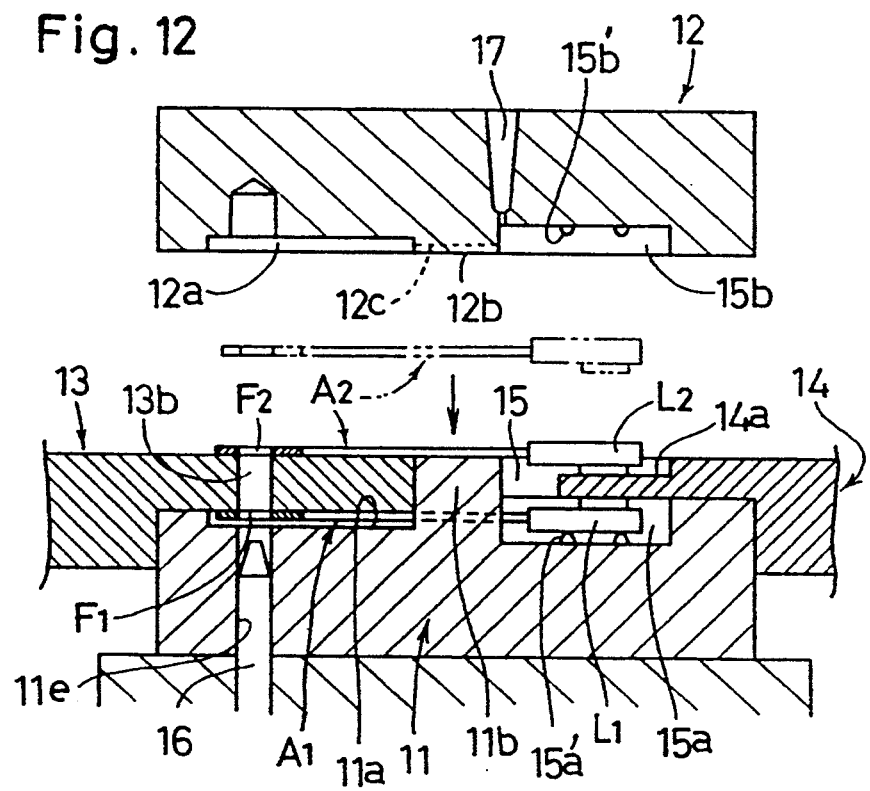
FIG. 12 is a sectional view similar to FIG. 11 but showing the same mold in its partially closed state.

Then, the respective side mold members 13, 14 are advanced toward each other, as shown in FIG. 12. In this condition, the respective closure projections 13a of the side mold member 13 intimately fit in the corresponding guide recesses 11c of the lower mold member 11 (see FIG. 10), whereas the respective spacers 14a of the other side mold member 14 rest on the corresponding light emitting devices L1.

In the meantime, the inverting mechanism 7 of the supply unit 2 is actuated for inverting the second leadframe A2 on the second transfer track 4 in the manner already described. At the end of the inverting operation, the second leadframe A2 is automatically transferred onto the first first transfer track 3 because the attraction provided by the magnets 7e of the respective inverting arms 7c is weaker than that provided by the magnets 5 of the first transfer track 3.

Then, the inverted second leadframe A2 is horizontally transferred into the molding unit 1 along the first transfer track 3 (as indicated by phantom lines in FIG. 12) and allowed to fall toward the lower mold member 11 (as indicated by solid lines in FIG. 12). As a result, the respective light receiving devices L2 are placed on the corresponding spacers 14a of the side mold member 14 with their reception faces directed downward, whereas the respective pairs of leads P2a, P2b are supported on the side mold member 13.

Then, the positioning pins 16 are raised for insertion into the respective feed holes F1, F2 of the first and second leadframes A1, A2 (see FIG. 6). As a result, the position of the respective leadframes A1, A2 are minutely adjusted relative to the respective mold members 11–14.

Then, the upper mold member 12 is lowered toward the lower mold member 11 and pressed downwardly, and the respective side mold members 13, 14 are also pressed in the advancing direction. As a result of such pressing, the emission face of each light emitting device L1 is pressed against the corresponding spacer 14a of the side mold member 14 by the corresponding lower backup projections 15a' while the reception face of each light receiving device L2 is also pressed against the corresponding spacer 14a by the corresponding upper backup projections 15b' (see FIGS. 6 and 7).

Then, fluid resin (not shown) is injected into the respective molding cavities 15 through the respective gates 17, and the fluid resin is allowed to harden. As a result, resinous molded packages M are formed for the respective pairs of photo devices L1, L2 (cf. FIG. 19).

Then, the mold is opened, and the respective leadframes A1, A2 with the molded packages are released from the mold by lifting up ejector pins (not shown) provided at the lower mold member 11. Finally, the leads P1a, P1b, P2a, P2b are cut off the respective leadframes A1, A2 to provide individual photointerrupters (cf. FIGS. 14 and 15).

The above process steps may be repeated with respect to successive pairs of leadframes to provide a multiplicity of photointerrupters.

Figure 20:
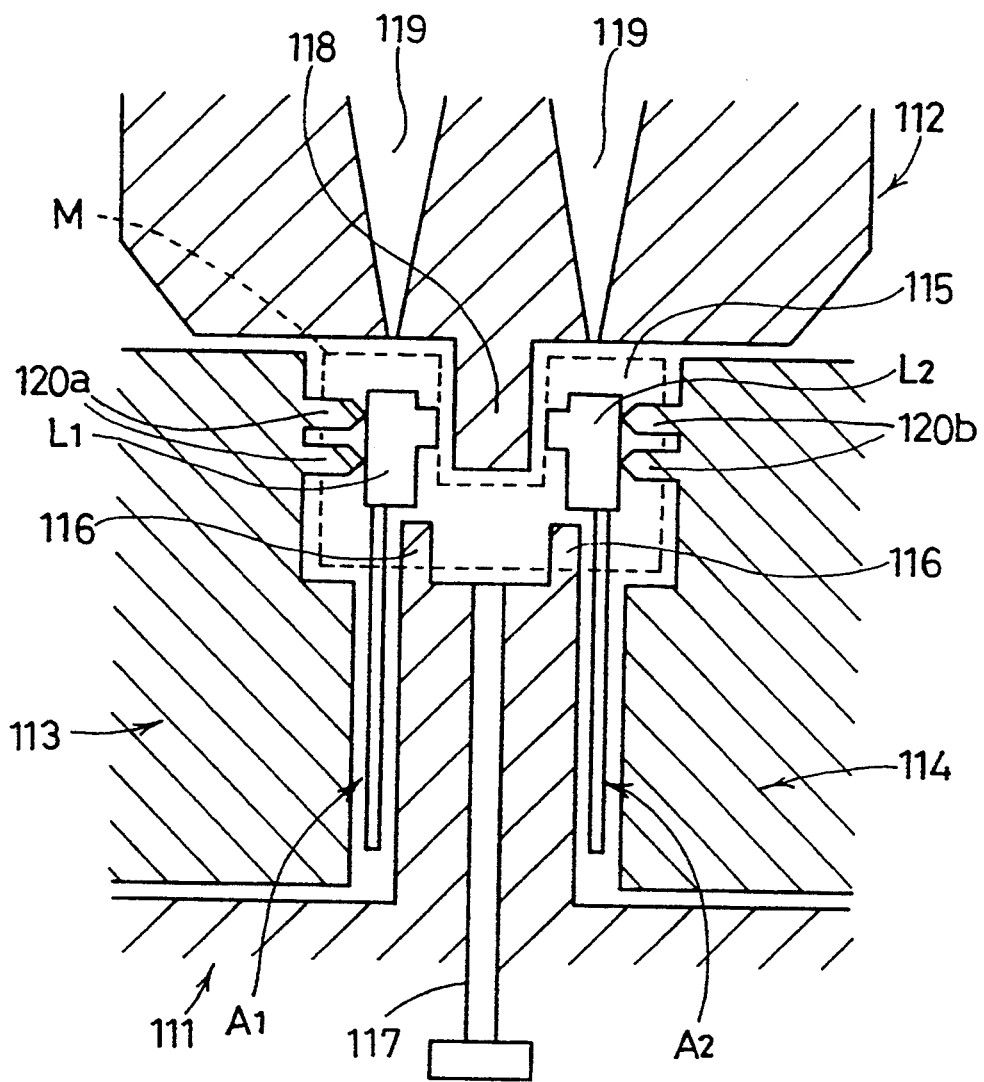
FIG. 20 is a sectional view showing a prior art mold.

According to the embodiment described above, the first and second leadframes A1, A2 may be transferred to and placed in the mold in a horizontal or lying posture. Thus, any member of the mold need not have special projections (cf. the projections 116 in FIG. 20) for vertically supporting the respective leadframes, so that the configuration of the mold may be simplified to reduce the cost for manufacturing the mold and to increase the service life of the mold. In addition, the absence of such support projections leads to corresponding reduction of holes in the molded package M, thereby improving the product value.

Further, the horizontal arrangement of the respective leadframes A1, A2 in the mold eliminates the necessity of inserting each of the leadframes into a narrow clearance. Thus, combined with the inverting mechanism 7, the molding operation may be performed easily and efficiently by automation, thereby reducing the molding cost.

Figure 13:
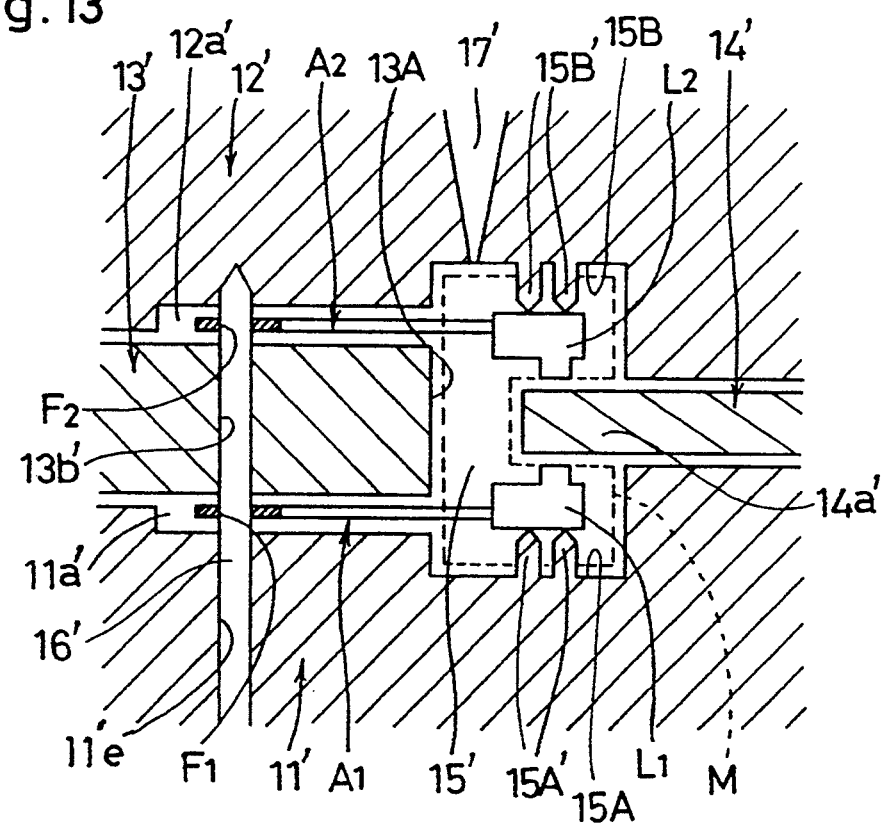
FIG. 13 is a sectional view showing a slightly modified mold to be incorporated in the manufacturing apparatus shown in FIG. 1.

FIG. 13 schematically shows a slightly modified mold which may be arranged at the molding unit 1 shown in FIGS. 1 and 2. The modified mold includes a fixed lower mold member 11' and a vertically movable upper mold member 12'. The mold further includes a pair of side mold members 13', 14' which are movable transversely of the respective leadframes A1, A2.

The lower mold member 11' has a plurality of lower molding recesses 15A spaced longitudinally of the respective leadframes A1, A2, whereas the upper mold member 12' has a plurality of upper molding recesses 15B also spaced longitudinally of the leadframes. When the mold is closed, each of the lower recesses 15A together with a corresponding upper recess 15B forms a molding cavity 15' for accommodating a corresponding light emitting device L1 and a corresponding light receiving device L2.

Each of the lower molding recesses 15A is provided with lower backup projections 15A' for pressing the corresponding light emitting device L1. Similarly, each of the upper molding recesses 15B is provided with upper backup projections 15B' for pressing the corresponding light receiving device L2.

The lower mold member 11' has a lower reception recess 11a' for receiving the first leadframe A1. The lower mold member 11' also has a plurality of guide bores 11e' which are spaced longitudinally of the respective leadframes A1, A2. Each of the guide bores 11e' receives a positioning pin 16' which is vertically movable into and out of the corresponding feed holes F1, F2 of the respective leadframes A1, A2.

The upper mold member 12' has an upper reception recess 12a' for receiving the second leadframe A2. Further, the upper mold member 12' is formed with a plurality of gates 17' in corresponding relation to the respective molding cavities 15'. Each of the gates 17' communicates with the corresponding molding cavity 15' for introducing fluid resin thereinto.

The side mold member 13' has an end face 13A for defining each of the molding cavities 15' when the side mold member 13' is completely advanced. The side mold member 13' is further formed with a plurality of through-holes 13b' in corresponding relation to the guide bores 11e' of the lower mold member 11'. Each of the through-holes 13b' allows passage therethrough of the corresponding positioning pin 16' for accurate positioning of the second leadframe A2 when the side mold member 13' is completely advanced.

The other mold member 14' has a plurality of spacers 14a' in corresponding relation to the respective molding cavities 15'. Each of the spacers 14a enters between the corresponding pair of optical devices L1, L2 within the corresponding molding cavity 15' when the mold member 14' is completely advanced.

The modified mold is used to form a resinous package M substantially in the same manner as already described in connection with the foregoing embodiment.

The present invention being thus described, it is obvious that the same may be varied in many ways. For instance, the resin injection gates 17 (17') may be provided at either one or both of the lower and upper mold members 11, 12 (11', 12'). Further, the positional relation between the first and second leadframes A1, A2 may be reversed, and the first leadframe A1 on the second transfer track 4 may be inverted by the inverting mechanism 7. Such variations are not to be regarded as a departure from the spirit and scope of the invention, and all such modifications as would be obvious to those skilled in the art are intended to be included within the scope of the following claims.

We claim:

1. A method of making molded photointerrupters including light emitting and light receiving devices by using a molding unit, a first leadframe carrying a plurality of said light emitting devices, and a second leadframe carrying a plurality of said light receiving devices, the molding unit comprising: a lower mold member; an upper mold member movable vertically toward and away from the lower mold member; and a pair of side mold members movable laterally toward and away from each other between the upper and lower mold members; the respective mold members forming a plurality of molding cavities when the molding unit is closed; the method comprising the successive steps of:

placing one of the first and second leadframes on the lower mold member in a generally horizontal posture while the upper mold member is raised away from the lower mold member with the respective side mold members retreated away from each other;

advancing the respective side mold members toward each other;

placing the other of the first and second leadframes on one of the side mold members in a generally horizontal posture such that said one of the side mold members is positioned between said first and second leadframes;

lowering the upper mold member toward the lower mold member to close the molding unit with a light emitting device and a light receiving device in each of said plurality of molding cavities; and introducing fluid resin into the respective molding cavities to form said molded photointerrupters.

2. The method according to claim 1, wherein said other leadframe is turned over before introducing into the molding unit.

3. The method according to claim 1, wherein before introducing the respective leadframes into the molding unit, the first leadframe is transferred along a first transfer track in a generally horizontal posture, whereas the second leadframe is transferred along a second transfer track also in a generally horizontal posture, the first and second transfer tracks being arranged side-by-side generally in parallel to each other.

4. The method according to claim 3, wherein said other leadframe is turned over before introduction into the molding unit.

5. The method according to claim 4, wherein the turning over of said other leadframe is performed by an inverting mechanism.

6. The method according to claim 5, wherein the inverting mechanism comprises at least one inverting arm which is pivotable between the first and second transfer tracks for picking up said other leadframe at the second transfer track and for releasing said other leadframe at the first transfer track.

7. The method according to claim 6, wherein the second transfer track is provided with a cutout for receiving the inverting arm under said other leadframe supported on the second transfer track.

8. The method according to claim 6, wherein the first transfer track is provided with at least one magnet, the inverting arm being provided with a magnet which affords weaker attraction than the magnet of the first transfer track.

* * * * *